United States Patent [19]

Taylor

[11] Patent Number: 5,175,509
[45] Date of Patent: Dec. 29, 1992

[54] FREQUENCY CONTROL CIRCUIT FOR SWEPT FREQUENCY OSCILLATOR

[75] Inventor: Kevin B. Taylor, Hertfordshire, England

[73] Assignee: Gec-Marconi Limited, England

[21] Appl. No.: 851,569

[22] Filed: Mar. 16, 1992

[30] Foreign Application Priority Data

Mar. 22, 1991 [GB] United Kingdom ............ 9106131

[51] Int. Cl.⁵ .................................... H03B 23/00
[52] U.S. Cl. ............................. 331/4; 331/178; 342/200
[58] Field of Search .............. 331/4, 178; 328/184; 455/164; 342/200

[56] References Cited

U.S. PATENT DOCUMENTS 4,342,007  7/1982  Elliott ..................... 331/178 X
4,499,435  2/1985  Thomson et al. ............ 331/44

*Primary Examiner*—Siegfried H. Grimm
*Attorney, Agent, or Firm*—Kirschstein, Ottinger, Israel & Schiffmiller

[57] ABSTRACT

Linearizing circuitry for an FMCW transmitter (1,2) employing a linear modulation waveform. The output signal is sampled (3,4,5) in successive intervals, small compared to the modulation period, and a cycle count (16) taken in each interval; a reference count is derived for each interval, either by way of a look-up table (21) triggered by a clock count (17) or derived by way of a clock driven processor (18). A comparison (20) is made and any error (22) is used to control (11) the phase of the modulation waveform.

9 Claims, 2 Drawing Sheets

(12)

FREQUENCY CONTROL CIRCUIT FOR SWEPT FREQUENCY OSCILLATOR

BACKGROUND OF THE INVENTION

1. Field of the Invention

This invention relates to control circuitry for correcting error in the rate of change of frequency of an oscillator output signal. The circuitry is particularly suitable for use in an FMCW radar transmitter, but the invention is not limited either to this application or, indeed, to oscillators operating only at radio frequencies.

2. Description of Related Art

Many radar and communication systems require the transmission of a carrier wave of continuously changing frequency. In particular, a constant rate of change of frequency is often desirable, i.e. a linear frequency-time waveform, as used, for example, in FMCW radars. In such radars it is necessary to correct any non-linearities in the frequency sweep of the transmit oscillator if good target range resolution is to be achieved. Correction of such non-linearities thus reduces errors likely to result in a target being allocated to an incorrect range bin.

SUMMARY OF THE INVENTION

It is an object of the present invention to provide frequency control circuitry suitable for use in correcting such non-linearities in the output of an FMCW transmitter.

According to one aspect of the invention, there is provided control circuitry for correcting frequency error in the output signal of an oscillator whose output frequency it is desired to change at a predetermined rate, the oscillator being controlled by a voltage waveform generator, the circuitry comprising counter means for producing a check count corresponding to the number of signal cycles occurring within a predetermined interval of lesser duration than the voltage waveform period, reference means for providing a reference count corresponding to the number of signal cycles which occur within the predetermined interval when said output frequency changes at said predetermined rate, and comparator means for comparing the check count and the reference count to produce an error signal for control of said generator.

Preferably check and reference counts are produced and compared for each of a plurality of successive predetermined intervals which occur within said waveform period. The predetermined rate may be a constant rate and the intervals may be of equal duration or may have durations which are such that all the intervals contain substantially the same number of signal cycles.

The reference means may comprise a memory in which the reference counts are stored in a look-up table or it may comprise a processor adapted to calculate the reference counts.

Preferably the counter means, the reference means and the comparator means may be formed in an integrated circuit.

According to another aspect of the invention, there is provided an FMCW transmitter for generating an r.f. signal whose frequency changes at a constant rate in a periodic manner, the transmitter comprising a variable frequency oscillator, a voltage waveform generator for modulating the output frequency of said oscillator, and control circuitry as aforesaid, arranged so that, in use, a signal of frequency corresponding to the frequency of the r.f. signal is supplied to said counter means, the control circuitry including control means adapted to control the generator in response to said error signal.

Preferably, the transmitter includes means for reducing the r.f. signal frequency by a fixed amount for supply to said counter means.

The control means may be adapted to adjust the phase of the waveform generator output.

BRIEF DESCRIPTION OF THE DRAWINGS

One embodiment of control circuitry in accordance with the present invention will now be described, by way of example only, with reference to the accompanying drawings, in which.

DETAILED DESCRIPTION OF THE PREFERRED EMBODIMENTS

Figure 1:
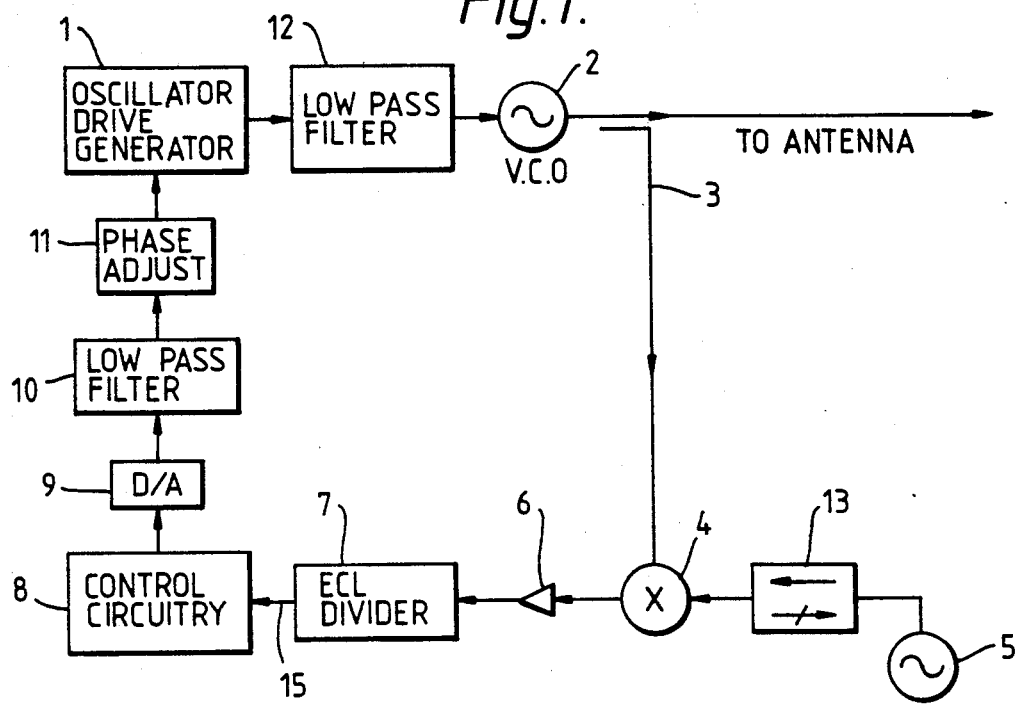
FIG. 1 is a block diagram of an FMCW transmitter incorporating such control circuitry.

Referring to the drawings, in FIG. 1 a voltage-controlled oscillator (VCO) 2 is driven by a voltage waveform generator 1. The oscillator 2 may suitably be of the FET or Gunn diode type. The generator 1 may be a linear ramp generator which produces a saw-tooth or triangular output waveform. A low-pass filter 12 removes any unwanted high frequencies from the generator output before it is applied to the oscillator 2. The oscillator output drives an antenna (not shown). As described so far FIG. 1 represents a conventional FMCW transmitter.

In accordance with the present embodiment of the invention the conventional arrangement is modified by the addition of a closed-loop feedback path, which includes control circuitry 8, between the oscillator output and a control input of the generator 1. The circuitry 8 is provided with a sample of the oscillator output, i.e. of the transmitted r.f. signal, preferably converted first to a lower frequency range. For this purpose, a coupler (3), mixer (4), local oscillator (5) of fixed frequency, and isolator (13) are provided, arranged in conventional manner, as shown. The lower frequency signal sample at the mixer output is applied to an amplifier 6. If necessary, the signal can be converted to an even lower frequency range by means of a pre-scaler (divider) 7, which suitably comprises emitter-coupled logic (ECL).

The control circuitry 8 will now be described with reference to FIG. 2. At an input 15 the down-converted signal sample from the oscillator output is supplied to a counter 16. A clock 17 determines fixed intervals substantially shorter than the modulation (ramp) period and the counter 16 counts the number of r.f. signal cycles which occur within each of these intervals. Each such 'check' count is then applied to a comparator 20. Since all the intervals have the same duration, the count will of course vary from interval to interval as the r.f. frequency changes over the ramp period. The appropriate reference count is output from the memory 21 at the end of each interval in response to a signal from the clock 17 and is applied to the comparator 20. The memory 21 is suitably programmable, for example RAM, so that different sets of reference counts can be stored according to the duration and/or number of the clocked intervals, or to the nature of the FMCW signal itself, i.e. its frequency sweep, sweep rate or period, etc. For each clocked interval, the reference count provided by the memory 21 and the actual check count made by the counter 16 are compared by the comparator 20 to produce a count error signal on line 22. This error signal comprises a digital word representing the difference between the two counts. It is indicative of the degree of deviation of the output signal frequency sweep from the ideal characteristic and is used to provide corrective adjustment of the oscillator drive waveform produced by the generator 1.

Referring again to FIG. 1, the digital output of the control circuitry 8 is fed to a digital-to-analogue converter 9, the output of which is filtered by low-pass filter 10 to remove any residual high frequency components resulting from the digital processing. The inclusion of two integrating filter stages (10,12) in the closed feedback loop helps to ensure stable operation.

The analogue filtered error signal is supplied to a control circuit 11, which is adapted to adjust the phase of the generator output. Thus, for example, if the measured check count in any one or more of the clocked intervals is lower than the reference count, then, assuming a ramp waveform having a positive slope, this indicates that the output frequency is not increasing fast enough and the phase of the drive waveform can be advanced accordingly. This phase adjustment can be conveniently made by adding the error signal to the drive waveform by means of a summing amplifier.

It will be appreciated that, where the clocked intervals occur successively throughout the FMCW modulation period, such corrections are made on a continual basis, with the error signal modified at the end of each interval. In circumstances, however, where the oscillator frequency is intended to change at a constant rate over only a portion of the modulation period, the cycle count measurements and corrections can be made over that portion exclusively.

The count intervals can conveniently (e.g., as described above) all have the same duration. This simplifies the clocking requirements. Since the number of cycles occurring in any interval depends upon the frequency range swept in that interval, the cycle count per interval will increase progressively over the drive waveform period, in the case of a simple sawtooth waveform, i.e. a ramp of positive slope. Since any errors in the counted number of cycles will be more significant at the lower frequency intervals, it may be desirable to select interval durations which are such that all the intervals contain substantially the same number of frequency cycles. Although this requires more complicated clocking circuitry (for instance with the individual interval durations stored in memory), the reference input to the comparator is reduced to one common expected count for all the intervals.

Figure 2:
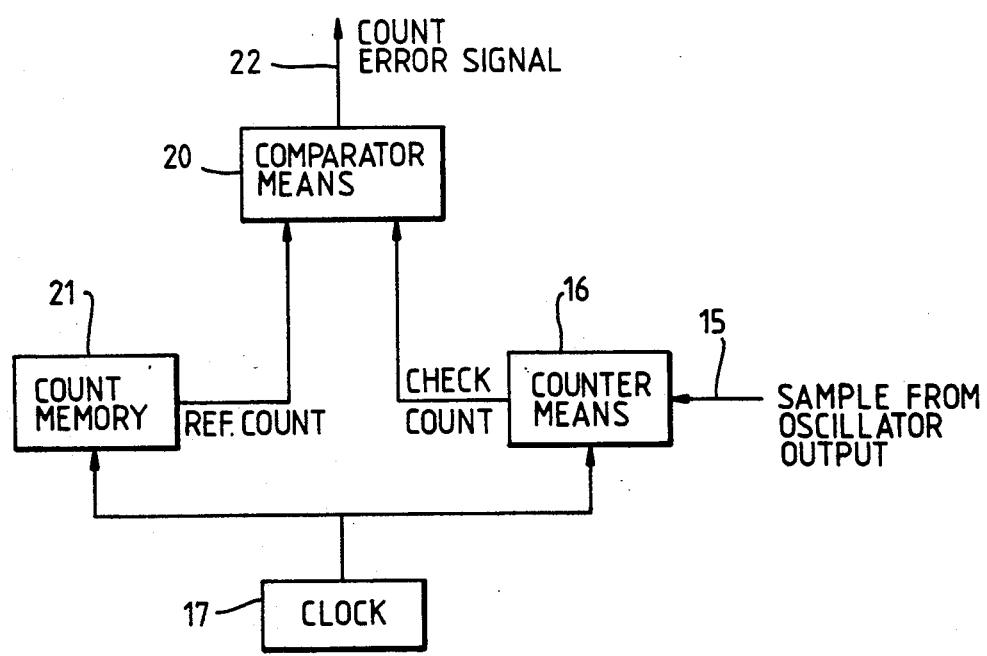
FIG. 2 is a block diagram of the control circuitry in greater detail.
Figure 3:
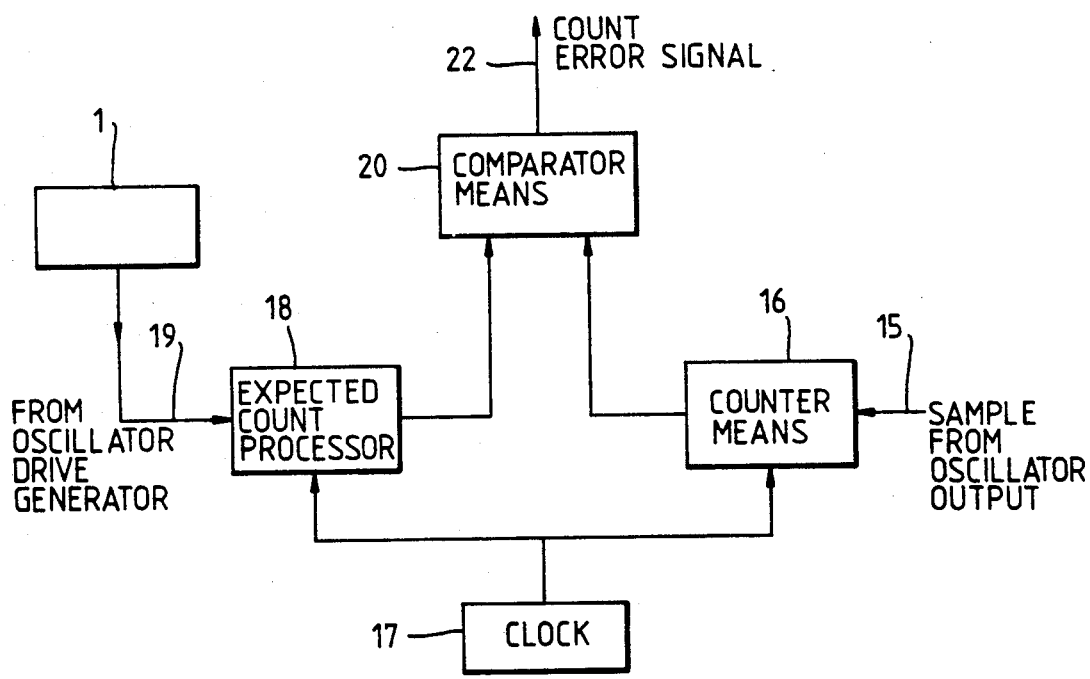
FIG. 3 is a block diagram of an alternative control circuitry to that of FIG. 2.

An alternative reference means for providing the reference counts will now be described with reference to FIG. 3, in which components common with FIG. 2 are referenced identically. In FIG. 3, the memory 21 (FIG. 2) has been replaced by a processor 18, controlled by the clock 17 and an input 19 from the oscillator drive generator 1. The processor 18 is adapted to calculate a reference count for each clocked interval. Since the oscillator frequency varies, or should vary, with time according to a known characteristic, the count calculation is suitably made by integrating the ideal characteristic over each clocked interval. Alternatively, the processor 18 may determine the expected count from the mean oscillator frequency over each interval. It will be appreciated that this method obviates the need for synchronizing the reference count read-out and the ramp waveform.

Processor 18 may be suitably combined with a programmable memory, so that, during an initial "calibration" phase, the reference counts are calculated by the processor 18 and stored in the memory. Subsequently, the stored counts are retrieved from memory for use by the comparator 20. Such an arrangement is particularly suitable in an application where the FMCW signal can be adjusted in terms of frequency sweep, sweep rate or period, etc.

While the invention is particularly applicable to conventional FMCW systems in which the frequency modulation is linear, it will be appreciated that a non linear frequency characteristic can be corrected if the count intervals are sufficiently short.

The control circuitry described above with reference to FIGS. 2 and 3 is suitably realized using logic elements. It accepts an analogue input signal—a sample of the oscillator output—and generates a digital error output signal. The circuitry may be conveniently embodied in an application specific integrated circuit (ASIC) to provide an accurate and highly reliable linearising circuit for use in an FMCW radar system. An ASIC device is particularly preferred in the demanding environment of a defence-related application.

Whereas the mixer/local oscillator arrangement shown in FIG. 1 for down-converting the oscillator output frequency is likely to be required in most applications, it will be appreciated that these components could be omitted if the oscillator frequency were sufficiently low, or the speed of the logic circuitry sufficiently high, for the control circuitry to handle signals directly from the oscillator output.

Control circuitry in accordance with the invention is not limited to use in FMCW systems. It has general application in controlling a signal whose frequency varies with time according to linear relationship.

I claim:

1. A frequency modulated signal generator circuit comprising:
    (a) a voltage controlled oscillator,
    (b) a ramp signal generator for producing a ramp signal comprising a succession of waveform sweeps, said generator being coupled to said oscillator for producing an output signal whose frequency is swept repeatedly,
    (c) sampling means for providing a check signal whose frequency corresponds to that of said output signal,
    (d) counter means for providing a check count corresponding to the number of cycles of said check signal in each of a plurality of intervals, said intervals being of substantially less duration than the duration of each sweep of said ramp signal generator,
    (e) reference means for providing a respective reference count corresponding to each said check count,
    (f) comparator means for comparing each said check count with the corresponding reference count and producing an error signal corresponding to the disparity between the reference count and the check count, and
    (g) means for correcting said ramp signal in dependence upon said error signal.

2. Control circuitry according to claim 1, including means for producing and comparing said check count and said reference count for each of a plurality of successive predetermined intervals which occur within said sweep duration.

3. Control circuitry according to claim 2, wherein said output signal frequency is swept at a constant rate and said predetermined intervals are of equal duration.

4. Control circuitry according to claim 2, wherein said output signal frequency is swept at a constant rate, and said predetermined intervals have durations which are such that all the intervals contain substantially the same number of signal cycles.

5. Control circuitry according to claim 1, wherein said reference means comprises a processor adapted to calculate said reference count.

6. Control circuitry according to claim 1 wherein said counter means, said reference means and said comparator means are formed in an integrated circuit.

7. A FMCW transmitter for generating an r.f. signal whose frequency changes at a constant rate in a periodic manner, said transmitter comprising a voltage controlled oscillator, a ramp signal generator for modulating the output frequency of said oscillator, and control circuitry counter means, reference means and comparator means according to claim 1 for supplying a signal of frequency corresponding to the frequency of said r.f. signal to said counter means, said control circuitry including control means adapted to control said generator in response to said error signal to tend to reduce said error signal.

8. An FMCW transmitter according to claim 7, including means for reducing the r.f. signal frequency by a fixed amount for supply to said counter means.

9. An FMCW transmitter according to claim 7, wherein said control means adjusts the phase of said ramp signal generator output.

* * * * *